United States Patent
Pawlak

(10) Patent No.: US 8,183,116 B2
(45) Date of Patent: May 22, 2012

(54) METHOD OF MANUFACTURING A DOUBLE GATE TRANSISTOR

(75) Inventor: Bartlomiej J. Pawlak, Heverlee (BE)

(73) Assignee: NXP B.V., Eindhoven (NL)

( * ) Notice: Subject to any disclaimer, the term of this patent is extended or adjusted under 35 U.S.C. 154(b) by 200 days.

(21) Appl. No.: 12/376,309

(22) PCT Filed: Aug. 1, 2007

(86) PCT No.: PCT/IB2007/053036
§ 371 (c)(1),
(2), (4) Date: Jun. 10, 2010

(87) PCT Pub. No.: WO2008/015649
PCT Pub. Date: Feb. 7, 2008

(65) Prior Publication Data
US 2010/0237351 A1    Sep. 23, 2010

(30) Foreign Application Priority Data
Aug. 4, 2006 (EP) .................................... 06118448

(51) Int. Cl.
*H01L 21/336* (2006.01)

(52) U.S. Cl. ........ 438/283; 257/250; 257/288; 257/331; 257/332; 257/365; 257/366; 257/E21.623; 257/E21.637; 257/E29.13; 257/E29.134; 438/157; 438/176; 438/195

(58) Field of Classification Search ............. 257/250, 257/331, E21.623, E21.637, 288, 332, 365, 257/366, E29.13, E29.134; 438/157, 195, 438/283, 176
See application file for complete search history.

(56) References Cited

U.S. PATENT DOCUMENTS

| | | | |
|---|---|---|---|
| 6,593,192 | B2 | 7/2003 | Zahurak et al. |
| 6,661,044 | B2 * | 12/2003 | Jang .............................. 257/288 |
| 7,154,135 | B2 * | 12/2006 | Hackler et al. ................ 257/250 |
| 2002/0160574 | A1 | 10/2002 | Zahurak et al. |
| 2003/0201494 | A1 | 10/2003 | Maeda et al. |
| 2003/0209761 | A1 | 11/2003 | Yagishita et al. |
| 2004/0188767 | A1 | 9/2004 | Weber et al. |
| 2004/0235280 | A1 | 11/2004 | Keys et al. |
| 2005/0037582 | A1 | 2/2005 | Dennard et al. |
| 2005/0189589 | A1 | 9/2005 | Zhu et al. |

FOREIGN PATENT DOCUMENTS

| | | |
|---|---|---|
| JP | 63253616 A | 10/1988 |
| WO | 2004088757 A | 10/2004 |
| WO | 2005022648 A1 | 3/2005 |
| WO | 2005117132 A1 | 12/2005 |

\* cited by examiner

*Primary Examiner* — Jay C Kim

(57) ABSTRACT

A planar double-gate transistor is manufactured wherein crystallisation inhibitors are implanted into the channel region (16) of a semiconductor wafer (10), said wafer having a laminate structure comprising an initial crystalline semiconductor layer (14) adjacent an amorphous semiconductor layer (12). Upon heating, partial re-growth of the amorphous semiconductor layer is restricted in the channel area thus allowing for the thickness of the source/drain extension regions to be increased whilst maintaining a thin channel. Any remaining amorphous material is selectively removed leaving a cavity to allow for the forming of gate electrodes (30,32) on opposing sides of the channel region. The invention can be exploited to a greater extent by providing an amorphous layer on both sides of the initial crystalline semiconductor layer thus providing for re-growth limitation in two directions.

13 Claims, 4 Drawing Sheets

METHOD OF MANUFACTURING A DOUBLE GATE TRANSISTOR

Figure 1A:
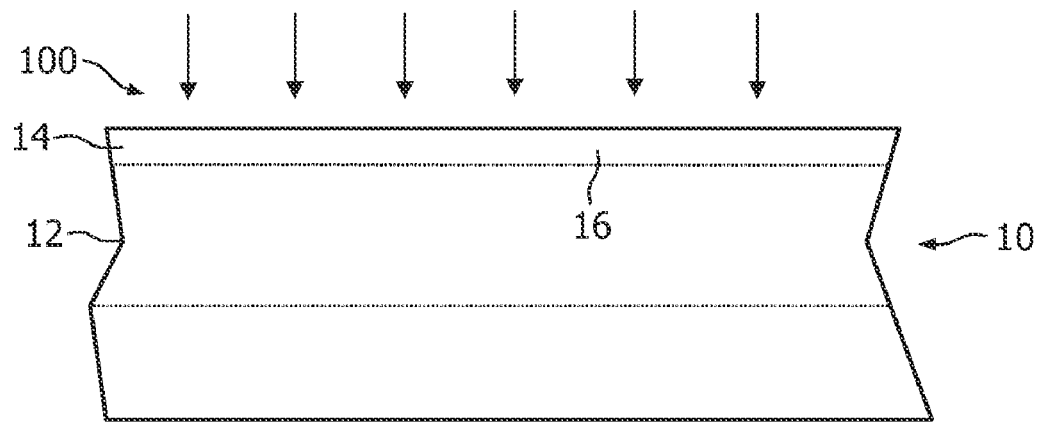

The invention relates to a method of manufacturing a double gate transistor comprising a channel region and two gate electrodes disposed on opposing sides of the channel region.

The desire for smaller and more compact electronic devices in today's electronics market presents the challenge to manufacturers to provide smaller and more compact integrated circuits (ICs) and other semiconductor devices in order to reduce manufacturing cost per IC and increase their computation power. Metal-oxide-semiconductor field-effect transistors (MOSFETs) are primary components of most ICs and, therefore, occupy a significant amount of wafer space. Reducing the size of MOSFETs in ICs, for sub-50 nm CMOS applications for example, plays a significant role in meeting the size-reduction challenge.

Several problems are associated with reducing the size of transistor devices. For example, short-channel effects are more likely to become apparent when the length of the conduction channel is made shorter. These effects are caused by the extension of the depletion region of the drain into the channel under the influence of a voltage on the drain. To suppress short-channel effects it is known to provide a transistor structure having more than one gate. Each gate is arranged to control the conduction of the channel by applying a voltage thereto from more than one direction.

An example of such a structure is the planar dual-gated MOSFET which has two gates that are positioned on opposite surfaces of a semiconductor body comprising the channel, separated therefrom by respective gate dielectrics. U.S. Pat. No. 6,593,192 discloses an example method of forming a dual-gate semiconductor-on-insulator (SOI) device in which a first gate is aligned with a second gate, each being formed on opposing sides of a semiconductor layer. In this, first gate structures are formed over active areas before a handle wafer is bonded to the upper surface of the structure and the bulk substrate is removed to expose the insulator layer. As shown in FIG. 8 of U.S. Pat. No. 6,593,192, portions of the insulator layer 20 are removed to form openings 26 between adjacent source and drain contact structures 58. Second transistor gate structures 95 are then formed within the openings 26, as shown in FIG. 9 of U.S. Pat. No. 6,593,192.

This method involves a transfer of the device onto a second carrier substrate which allows the subsequent processing of the second side of the channel leading to the forming of the second gate. The substrate transfer requires many process steps thus adding to the time and cost associated with the manufacture. Furthermore, in order to accurately align the two gates with one another, several process steps are required which adds to the expense further still.

It is therefore an object of the invention to provide an improved method of manufacturing a double gate transistor. It is another object of the invention to provide an improved method of manufacturing a double gate transistor which comprises a thinned channel region but does not require a transfer of the device onto a second carrier substrate for processing of the second gate.

According to the invention there is provided a method of manufacturing a double gate transistor comprising a channel region and two gate electrodes disposed on opposing sides of the channel region, the method comprising the steps of providing a semiconductor wafer with a laminate structure comprising an initial crystalline semiconductor layer which comprises a channel region, adjacent an amorphous semiconductor layer; introducing crystallisation inhibitors into a selected region of the semiconductor wafer, said selected region extending through the amorphous semiconductor layer in a position corresponding to the lateral position of the channel region; performing a crystallisation operation so as to crystallise regions of the amorphous semiconductor layer outside of the selected region thereby forming a developed crystalline semiconductor layer having a greater thickness than that of said initial crystalline semiconductor layer away from said selected region and a substantially similar thickness to that of said initial crystalline semiconductor layer within the selected region; selectively removing remaining amorphous semiconductor material; and, forming gate electrodes on opposing sides of the channel region. The introducing of crystallisation inhibitors within the channel region provides a simple route to tailoring the channel thickness by means of epitaxial regrowth of the crystalline semiconductor. Whilst the areas outside of the selected region are grown, e.g. to form more substantial source/drain extensions, the growth of the channel is limited thus resulting in a thin gate which ensures electrostatic device integrity.

The laminate structure may comprise a further amorphous semiconductor layer adjacent the major surface of the initial crystalline semiconductor layer remote said amorphous semiconductor layer, and the selected region extending through both amorphous semiconductor layers, and wherein the crystallisation step serves also to crystallise regions of the further amorphous semiconductor layer outside of the selected region. By providing an amorphous layer either side of the crystalline semiconductor layer, the channel can, advantageously, be thinned from both sides. The crystallisation inhibitors are introduced through the thickness of the laminate structure thus limiting the regrowth of the crystalline channel region. It will be appreciated that the thickness of the crystalline semiconductor layer between the two amorphous layers essentially determines the thickness of the channel in the final device.

The amorphous layer, or layers, can be provided by amorphizing a layer within a crystalline semiconductor substrate. Preferably this is done by implanting ions into a major surface of the crystalline semiconductor substrate. In the case of the laminate structure comprising two amorphous layers separated by the crystalline semiconductor layer, ions are implanted at two different energies to amorphize the layer at two different depths within the crystalline semiconductor substrate. The step of introducing crystallisation inhibitors may be carried out before said step of amorphizing.

In an alternative embodiment, the step of providing a semiconductor wafer includes depositing an amorphous semiconductor layer on a crystalline semiconductor substrate. This avoids the need for the deep underlying amorphisation steps and allows less damage in the crystalline layer and more accurate control of the layer thickness by more controllable epitaxial deposition for example.

The crystallisation inhibitors preferably comprise fluorine ions, but may alternatively comprise carbon or nitrogen.

The step of introducing crystallisation inhibitors may comprise the steps of depositing a mask layer over the semiconductor wafer; patterning the mask layer to expose a region of the semiconductor wafer surface; and, implanting the crystallisation inhibitors into the semiconductor wafer.

The amorphous semiconductor layer(s) are preferably crystallised by performing a solid phase epitaxial regrowth of the amorphous semiconductor layer(s) by heating the laminate structure to a temperature in the range of 550 C to 600 C for example. The thickness of the crystalline semiconductor layer outside of the channel is determined by this process.

The invention will now be described, by way of example only, with reference to the accompanying drawings wherein;

FIGS. 1A to 1D show sectional views of a dual-gate semiconductor device at various stages of manufacture according to a first embodiment of the invention; and, FIGS. 2A to 2D show sectional views of a dual-gate semiconductor device at various stages of manufacture according to a second embodiment of the invention It will be appreciated that the figures are merely schematic and are not drawn to scale. In particular certain dimensions such as the thickness of layers or regions may have been exaggerated whilst other dimensions may have been reduced. The same reference numerals are used throughout the figures to indicate the same or similar parts. It should also be appreciated that the figures only show the device in sectional view and that other features may be present in a different plane to that shown, for example, behind or in front.

The invention involves the processing of a semiconductor wafer. With reference to FIG. 1A, a semiconductor wafer 10, of crystalline silicon in this case, is provided and supported in a manner conventional with CMOS technology. It should be appreciated that the figures show in section only a very small portion of the wafer and that many devices are typically processed on the same wafer. Furthermore, the invention is not limited to silicon and the semiconductor may alternatively be of Ge, SiGe or GaAs for example.

A major surface, the top surface in this example, of the silicon substrate 10 is subjected to an implantation of germanium ions 100 to amorphize a layer 12 at a predetermined depth within the substrate 10. The energy of the ion implant can be adjusted to tune the thickness and depth of the amorphous layer 12. The implantation is carried out at an energy of around 30-200 keV and at a dosage within the range of 1e13 to 4e14 atoms/cm$^2$. Alternatively, Si, Ar or Xe ions can be used instead of germanium.

The result of the amorphisation is a semiconductor wafer having a laminate structure comprising a crystalline semiconductor layer 14 which comprises a channel region 16, adjacent an amorphous semiconductor layer 12.

Figure 1B:
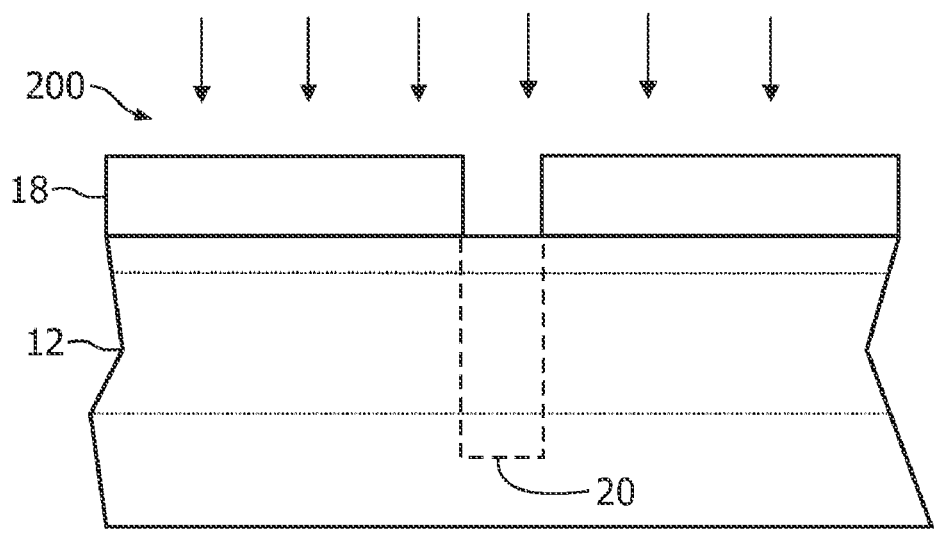

Following the amorphisation, a masking layer 18 is deposited on the substrate 10. The masking layer is a commercially available polymer photoresist. This mask layer 18 is then patterned (as shown in FIG. 1B) to expose a region in the wafer surface. The exposed region is rectangular in shape but may be any shape to fit the purpose, e.g. circular.

In accordance with the invention and reference by 200, crystallisation inhibitors are implanted into the semiconductor wafer 10. The crystallisation inhibitors comprise fluorine ions and are implanted at a dose within the range of 5e14 to 2e15 atoms/cm$^2$ and having an energy of 2-15 keV. The masking layer 18 prevents the fluorine ions from hitting the masked region of the wafer 10. As a result, the fluorine ions are only introduced into a selected region 20 of the wafer 10, the selected region 20 extending through the amorphous semiconductor layer 12 in a position corresponding to the lateral position of the channel region 16. It should be appreciated that other crystallisation inhibitors can instead be employed such as O, N, C, and Cl for example.

The masking layer 18 is then removed in a known manner. A crystallisation operation is then carried out so as to crystallise regions of the amorphous semiconductor layer 12 outside of the selected region 20. A solid phase epitaxial regrowth of the amorphous semiconductor layer 12 is carried out by heating the laminate structure 10 to a temperature in the range of 550 C to 600 C. The presence of the crystallisation inhibiters within the selected region 20 serves to slow down the rate of recrystallisation within the selected region.

Therefore, the amorphous silicon layer 12 outside the selected region 20 recrystallises faster than that within the selected region by a factor of five to ten times.

Figure 1C:
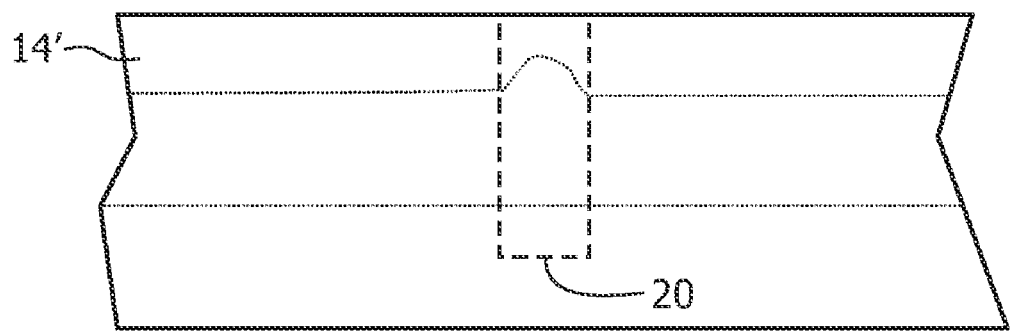
Figure 1D:
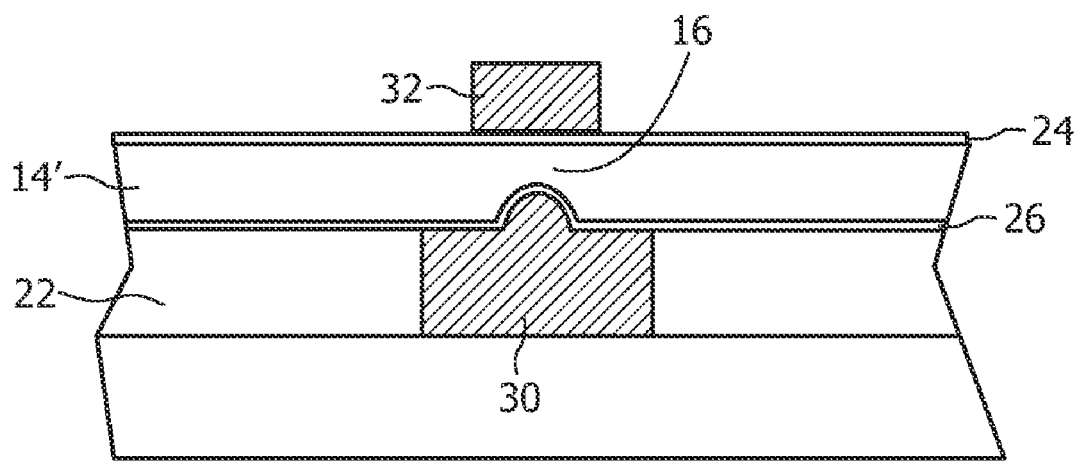

The result is a developed crystalline semiconductor layer 14' having a greater thickness than that of said initial crystalline semiconductor layer 14 away from said selected region 20. However, due to the significantly restricted regrowth in the selected region 20 caused by the fluorine ions, the developed crystalline semiconductor layer 14' within the selected region 20 has a substantially similar thickness to that of said initial crystalline semiconductor layer 14 as illustrated in FIG. 1C.

The thinner part of the developed crystalline silicon layer 14' will eventually form the channel of the double gate transistor. Advantageously, the invention allows the fabrication of a semiconductor layer having a region of reduced thickness for the gate-controlled electron channel whilst also having regions of greater thickness for the low-resistivity source/drain extensions. Furthermore, the simplicity of the processing associated with the use of the crystallisation inhibitors makes the process very attractive for introduction in existing CMOS process flows in which the introduction of new and expensive apparatus would not be required.

In a next step following the partial solid phase epitaxial regrowth, the remaining amorphous semiconductor material of the amorphous semiconductor layer 12 (now of reduced thickness) is selectively removed by performing a wet etch using HF acid for example. The result is a cavity 22 below the developed crystalline layer 14'. Access holes/trenches (not shown) are formed through the developed crystalline layer 14' to enable access to the amorphous layer, and eventually to the cavity, through a major surface of the wafer 10.

Gate dielectric layers 24 and 26 (FIG. 1D) are formed on the upper and lower surfaces of the developed crystalline layer 14' respectively. This may be done by heating the structure in an oxidising ambient such that the lower dielectric layer is formed via the access holes. The gate dielectric layers 24 and 26 are approximately 1.5 nm in thickness and serve to insulate the gates from the channel region 16.

The cavity 22 is then filled with a metal such as TiN through the access holes (not shown). It should be appreciated that any conductive material fulfilling the work function requirements of a gate can be employed. This metal is patterned using a timed wet etch [correct] to leave a lower gate 30 positioned under the channel region 16 within the cavity 22. Connections to the lower gate 30 may, for example, be made through the access trenches.

The upper gate 32 is formed using known lithographic techniques which may include a metal deposition which is then patterned.

It is envisaged that there are many routes in which the gates can be formed on either side of the channel region after the amorphous layer 12 has been removed. The skilled person will not have any difficulty in exploiting known processing techniques to fabricate these gates and tailor the structure for the final device. It should be appreciated that the invention provides a simple wafer-based process to fabricate a planar double-gate device having a channel region which is significantly thinner than the source/drain extensions provided in the same semiconductor layer.

The order in which the process steps are carried out is flexible to a certain extent. For example, the crystallisation inhibitors may be introduced at an earlier stage, as is the case in the second embodiment described which will now be described.

Figure 2A:
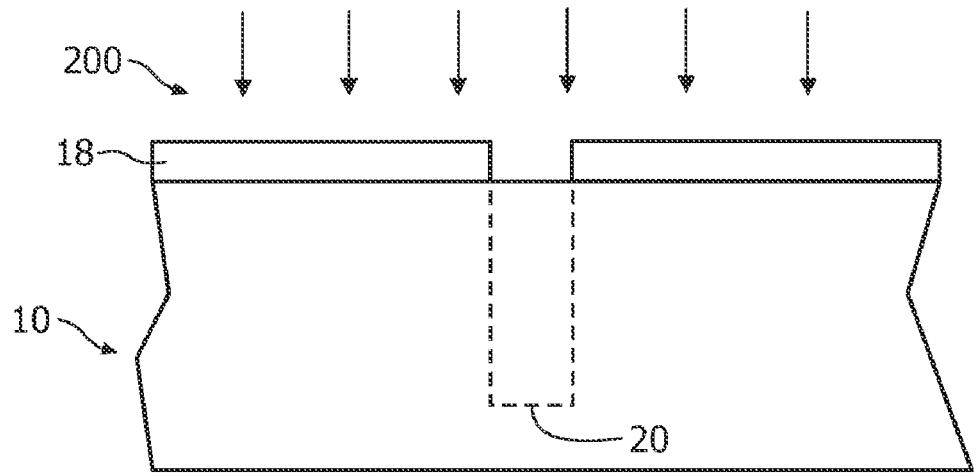

A masking layer 18 is deposited over a crystalline silicon wafer 10 and patterned to expose a region of the wafer surface as shown in FIG. 2A. Fluorine ions are then implanted into a selected region 20 of the semiconductor wafer as defined by the patterned mask 18, and which process is referenced at 200. Conditions for the implant are similar to those described for the first embodiment.

Figure 2B:
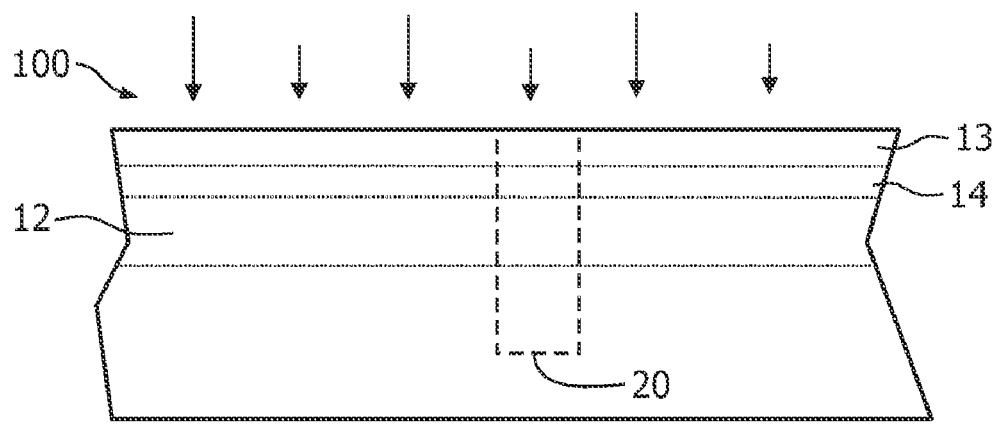
Figure 2C:
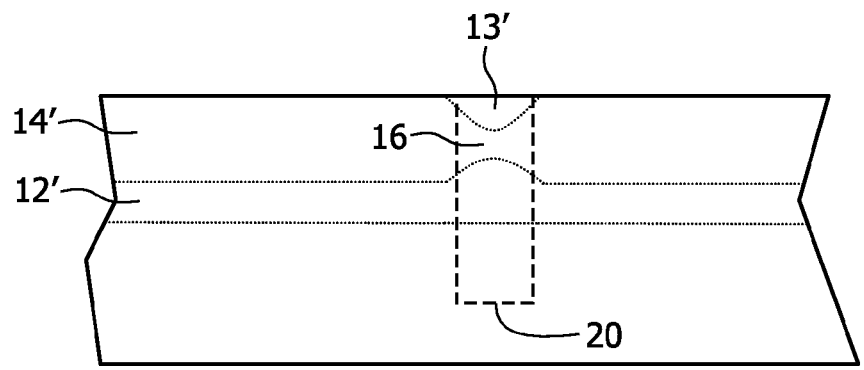
Figure 2D:
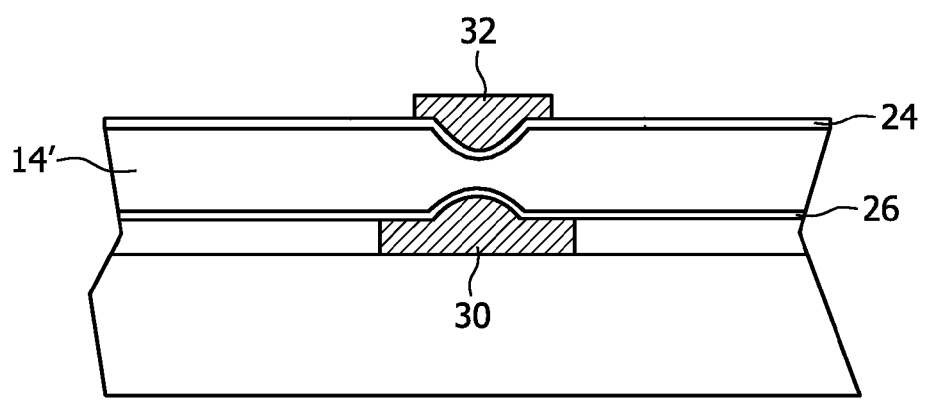

After the fluorine implant 200, the masking layer 18 is removed. A wafer-wide amorphizing implant 100 is then carried out at two different energies to amorphize two layers of different depths within the crystalline wafer 10. For example, one set of germanium ions is implanted at an energy of 30-200 keV to amorphize a layer 12 at a depth of around 20 nm down to a depth of 60 nm as shown in FIG. 2B. The position of the deep amorphous layer will depend on the desired channel thickness and the top amorphous layer. A second set of germanium ions is implanted at a lower energy to create an amorphous layer 13 near the top surface of the wafer 10. This leaves a crystalline silicon layer 14 sandwiched between two amorphous silicon layers 12, 13. Although the process is described as "wafer-wide" it should be recognised that the amorphisation can be applied on a local scale, I.e. to selected regions of the wafer, and remain within the scope of the invention.

The laminate structure is then heated so as to partially re-grow the amorphous silicon layers 12,13, to a much greater extent outside of the fluorine-implanted region 20 than within. The regrowth occurs at the major surfaces of the crystalline silicon layer 14 which are in contact with the amorphous silicon layers 12, 13. The crystalline silicon layer 14 grows so that its thickness increases. As in the first embodiment, the growth is restricted within the fluorine-implanted region 20 so that the developed crystalline silicon layer 14' has a corresponding area of reduced thickness 16 in which the channel of the final double-gate device will be located. However, in this embodiment, the re-growth of the channel region 16 is restricted in two directions which allows for an even thinner channel region relative to the thickness of the source/drain extension regions. The re-grown, or developed, crystalline silicon layer 14' can be seen in FIG. 2C, together with the remaining parts of the amorphous silicon layers 12',13'.

The subsequent processing does not differ significantly from the first-described embodiment. In summary of the process steps associated with FIG. 2D, the remaining amorphous silicon material 12',13' is selectively removed by a wet etch, employing access trenches (not shown) in the wafer's major surface, thus leaving a cavity under the developed crystalline silicon layer. The upper and lower gate dielectric layers 24, 26 are formed in the same way as before. Also, the upper and lower metallic gates 32, 30 are formed in a similar manner.

Although the above-described embodiment employs amorphisation of a crystalline semiconductor wafer to form the two amorphous layers in the laminate structure, it is envisaged that other techniques such as deposition. For example, the laminate structure may be built up with a series of deposition steps. Alternatively, one amorphous layer may be formed by amorphisation and the other by deposition.

In summary, there is provided a planar double-gate transistor wherein crystallisation inhibitors are implanted into the channel region of a semiconductor wafer, said wafer having a laminate structure comprising an initial crystalline semiconductor layer adjacent an amorphous semiconductor layer. Upon heating, partial re-growth of the amorphous semiconductor layer is restricted in the channel area thus allowing for the thickness of the source/drain extension regions to be increased whilst maintaining a thin channel. Any remaining amorphous material is selectively removed leaving a cavity to allow for the forming of gate electrodes on opposing sides of the channel region. The invention can be exploited to a greater extent by providing an amorphous layer on both sides of the initial crystalline semiconductor layer thus providing for re-growth limitation in two directions.

Various modifications and variations are possible, as will be appreciated by persons skilled in the art.

The invention claimed is:

1. A method of manufacturing a double gate transistor comprising a channel region and two gate electrodes disposed on opposing sides of the channel region, the method comprising the steps of:
   providing a semiconductor wafer with a laminate structure comprising an initial crystalline semiconductor layer which comprises a channel region, adjacent an amorphous semiconductor layer,
   introducing crystallisation inhibitors into a selected region of the semiconductor wafer, said selected region extending through the amorphous semiconductor layer in a position corresponding to a lateral position of the channel region;
   performing a crystallisation operation so as to crystallise regions of the amorphous semiconductor layer outside of the selected region thereby forming a developed crystalline semiconductor layer having a greater thickness than a thickness of said initial crystalline semiconductor layer away from said selected region and a substantially similar thickness to the thickness of said initial crystalline semiconductor layer within the selected region;
   selectively removing remaining amorphous semiconductor material; and
   forming gate electrodes on opposing sides of the channel region.

2. A method according to claim 1, wherein the laminate structure comprises a further amorphous semiconductor layer adjacent a major surface of the initial crystalline semiconductor layer remote from said amorphous semiconductor layer, and the selected region extends through both amorphous semiconductor layers, and wherein the crystallisation step serves also to crystallise regions of the further amorphous semiconductor layer outside of the selected region.

3. A method according to claim 1, wherein the step of providing said semiconductor wafer includes:
   amorphizing a layer within a crystalline semiconductor substrate to form said amorphous semiconductor layer.

4. A method according to claim 3, wherein said amorphizing comprises implanting ions into a major surface of the crystalline semiconductor substrate.

5. A method according to claim 2, wherein the step of providing said semiconductor wafer includes:
   amorphizing two layers having different depths within a crystalline semiconductor substrate by implanting ions into a major surface of the crystalline semiconductor substrate at two different energies so as to form both amorphous semiconductor layers.

6. A method according to claim 3, wherein said step of introducing said crystallisation inhibitors is carried out before said step of amorphizing.

7. A method according to claim 1, wherein the step of providing said semiconductor wafer includes:
   depositing the amorphous semiconductor layer on a crystalline semiconductor substrate.

8. A method according to claim 1, wherein said crystallisation inhibitors comprise fluorine ions.

9. A method according to claim 1, wherein said step of introducing said crystallisation inhibitors comprises the steps of:

depositing a mask layer over the semiconductor wafer;

patterning the mask layer to expose a surface region of the semiconductor wafer; and, implanting the crystallisation inhibitors into the semiconductor wafer.

10. A method according to claim 1, wherein said step of crystallising the regions of the amorphous semiconductor layer comprises performing a solid phase epitaxial regrowth of the amorphous semiconductor layer.

11. A method according to claim 10, wherein said solid phase epitaxial regrowth includes heating the laminate structure to a temperature in the range of about 550° C. to about 600° C.

12. A method according to claim 1, wherein said step of selectively removing said remaining amorphous semiconductor material comprises performing a wet etch.

13. An integrated circuit comprising a double gate transistor manufactured by a method according to claim 1.

* * * * *